United States Patent [19]
Kinzer

[11] Patent Number: 5,625,226
[45] Date of Patent: Apr. 29, 1997

[54] SURFACE MOUNT PACKAGE WITH IMPROVED HEAT TRANSFER

[75] Inventor: Daniel M. Kinzer, El Segundo, Calif.

[73] Assignee: International Rectifier Corporation, El Segundo, Calif.

[21] Appl. No.: 516,683

[22] Filed: Aug. 18, 1995

Related U.S. Application Data

[63] Continuation of Ser. No. 308,739, Sep. 19, 1994.

[51] Int. Cl.$^6$ .................. H01L 23/495; H01L 23/10; H01L 23/34
[52] U.S. Cl. .................. 257/705; 257/675; 257/707; 257/720; 257/719
[58] Field of Search .................. 257/706, 707, 257/711, 719, 720, 712, 713, 718, 796

[56] References Cited

U.S. PATENT DOCUMENTS

| 4,891,686 | 1/1990 | Krausse | 257/706 |
|---|---|---|---|
| 5,345,106 | 9/1994 | Doering et al. | 257/707 |

FOREIGN PATENT DOCUMENTS

| 0484180 | 1/1991 | European Pat. Off. | 257/706 |
|---|---|---|---|
| 0484180A1 | 10/1991 | European Pat. Off. | 257/706 |
| 6-149446 | 3/1986 | Japan | 257/796 |
| 4-123462 | 4/1992 | Japan | 257/706 |
| 6-132425 | 5/1994 | Japan | 257/706 |
| 2154791 | 9/1985 | United Kingdom | 257/707 |

OTHER PUBLICATIONS

"Electronic Packaging and Interconnection Handbook", pp.7.24–7.25; C. Harper.

*Primary Examiner*—Mahshid D. Saadat
*Assistant Examiner*—Jhihan B. Clark
*Attorney, Agent, or Firm*—Ostrolenk, Faber, Gerb & Soffen, LLP

[57] ABSTRACT

One surface of a metal heat transfer slug contacts the surface of a semiconductor die which contains junction diffusions. The slug and die are molded into a surface mount package which exposes the opposite surface of the slug. Terminal leads are internally connected to the junction diffusions and extended beyond the molded periphery of the package.

11 Claims, 2 Drawing Sheets

SURFACE MOUNT PACKAGE WITH IMPROVED HEAT TRANSFER

This is a continuation of application Ser. No. 08/308,739, filed on Sep. 19, 1994.

BACKGROUND OF THE INVENTION

This invention relates to surface mount packages for semiconductor devices, and more specifically relates to a novel surface mount package in which the conductive metal plug to be connected to a surface heat sink is connected to the side of the semiconductor die containing the heat-generating junctions to improve cooling efficiency and to reduce the resistance of MOS-gated semiconductor devices.

Surface mount packages are in widespread use and normally consist of a semiconductor die mounted with its back surface in contact with the surface of a lead frame and with its front surface having wires from connection pads to the lead extensions of the lead frame. The bottom of the lead frame is then located atop a heat-conducting slug, the bottom surface of which is to be connected to a flat surface which subsequently receives the surface mount package. The assembly of die, lead frame and heat-conducting slug are then over-molded, with the flat bottom surface of the slug exposed for surface connection, and with the lead frame leads extending out of the molded housing to be available for external connection.

This standard surface mount package design has the disadvantage, particularly in the case of MOS-gate controlled devices, that heat is generated primarily at the top of the die, so that heat must flow through the full thickness of the silicon die, and through the metal slug at the die bottom to the heat exchange surface to which the device is mounted. This increases the temperature of the device at a given load condition and increases the on-resistance or forward voltage drop of MOS-gate controlled devices. In addition, the source or emitter bond wires add resistance and inductance to the device, and the current flow in the surface metallization adds to the resistance as well.

BRIEF DESCRIPTION OF THE INVENTION

In accordance with the invention, a novel surface mount package is provided in which the bottom surface of a die is connected to the bottom surface of the lead frame. The terms bottom and top surfaces are used herein, considering the surface of the package to be connected to a mounting surface as the "bottom" of the package and its related parts. The top surface of the heat conductive slug is then connected to the bottom or downwardly facing surface of the die (which is ordinarily considered its top surface), which is the die surface containing the heat-generating junctions in a MOS-gate device, such as a power MOSFET, IGBT, gate controlled thyristor and the like. The surface of the slug contacting the die is suitably shaped to avoid contact to or shorting of lead pads or gate fingers, or the like, but will contact a major portion of the main electrode of the die, for example, the source of a power MOSFET or the emitter of an IGBT. In such devices, the drain contact or collector contact will be soldered to the bottom of the lead frame.

The device is then over-molded, leaving the bottom surface of the slug exposed, with the lead frame leads attached to the appropriate terminals or connection pads on the die and extending beyond the borders of the package.

Heat flow from the die to the bottom surface of the slug is improved and the die thickness is no longer in the heat flow path. There is no longer a significant resistance or inductance in the source or emitter electrode. The device will experience lower temperature rise and reduced on-resistance for a power MOSFET or reduced forward voltage drop for an IGBT or other MOS-gated devices.

Other features and advantages of the present invention will become apparent from the following description of the invention which refers to the accompanying drawings.

DETAILED DESCRIPTION OF THE DRAWINGS

Figure 1:
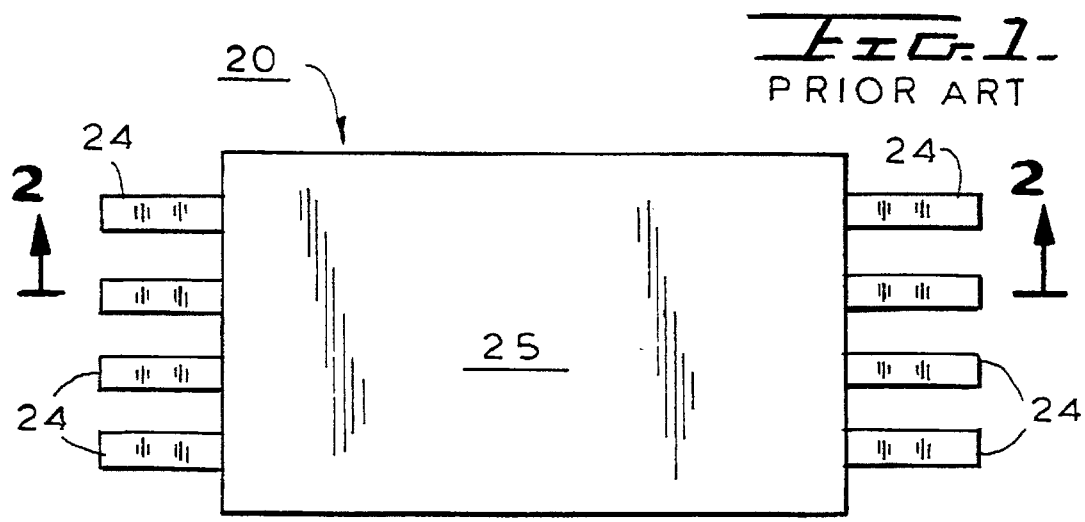
FIG. 1 is a top view of a prior art surface mounted housing.
Figure 2:
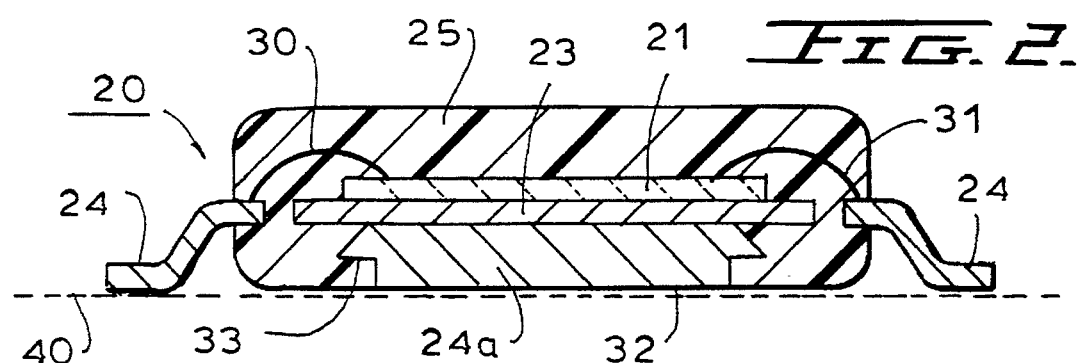
FIG. 2 is a cross-sectional view of FIG. 2 taken across section line 2—2 in FIG. 1.

Referring first to FIGS. 1 and 2, there is shown therein a standard prior art surface mount package 20. The package consists of a semiconductor die 21 (FIG. 2) which can be any type of device, for example, a diode, transistor (bipolar or MOSFET), thyristor, or the like. The bottom surface of die 21 is usually metallized and is soldered to the top surface of the large area die-receiving portion 23 of a conventional stamped lead frame. The lead frame also has extending terminal portions or fingers 24 which are separated from the body 23 after the package is molded. A metal slug 24a which is a heat sink, is pressed against and in thermal and/or electrical contact with the bottom surface of lead frame body 23. A molding compound of conventional material then forms a molded insulation housing 25 around the parts to provide a protective housing. The internal connection regions of die 21 are bonded to appropriate ones of terminals 24, by bonding wires 30 and 31 (FIG. 2) before the molding operation. Note also that the flat bottom 32 of slug 24a projects slightly beyond the bottom of molded housing 25. Slug 24a may have a peripheral notch 33 to lock it into the plastic.

In use, the device 20 can be soldered down to a flat surface, shown by dotted line 40, which may have a metallized pattern for receiving the coplanar bottoms of leads 24 and surface 32.

It is desired to remove heat from die 21 as efficiently as possible in the package of FIGS. 1 and 2. However, the presence of lead frame 23 and its interfaces to die 21 represent a thermal impedance, as does the body of the silicon die 21, especially when substantial heat is generated at the top surface of the die 21.

It is also desired to eliminate resistance and inductance in the electrode connections.

Figure 3:
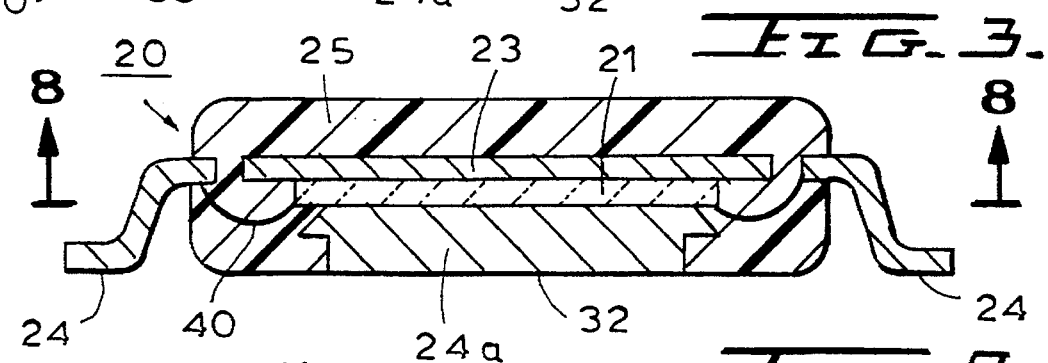
FIG. 3 is a cross-sectional view similar to that of FIG. 2, but shows the improvement of the invention.

In accordance with the present invention, and as shown in FIG. 3, the bottom surface of die 21 (which is metallized over its full area) is soldered or otherwise electrically and/or thermally connected to the bottom of the lead frame body 23. The top, or junction receiving and contact pad-containing surface of die 21 faces downwardly.

The "top surface" of die 21 (which faces downwardly in FIG. 3) then receives the top surface of slug 24a in electrical and/or thermal contact and may be soldered thereto. The pads on the downwardly facing top surfaces of die 21 are wire-bonded to lead frame extensions 24, as by lead wire 40 in FIGS. 3 and 8, which connect the gate pad 42 (FIG. 8) on die 21, where die 21 is a MOS-gated device, such as a power MOSFET, IGBT, MOS-gated thyristor, or a standard thyristor.

Figure 8:
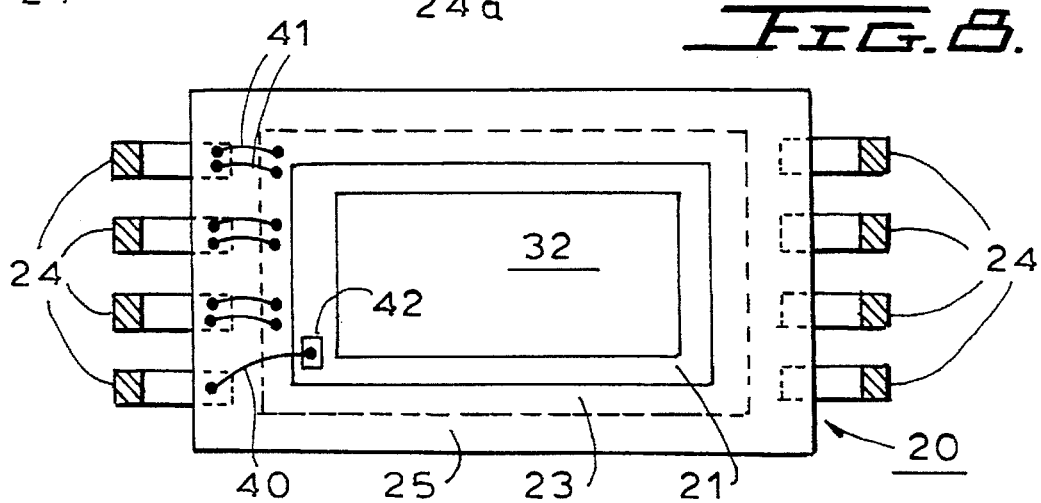
FIG. 8 is a view of FIG. 3, as seen from section line 8—8 in FIG. 3, using a chip of different pad configuration than that of FIGS. 4 and 5.

The bottom drain contact of die 21 is connected directly to lead frame body 23, and plural bonding wires 41 connect the drain to lead frame fingers 24, as shown in FIG. 8.

Significantly, the novel structure eliminates two solder interfaces and the lead frame region 23 from the thermal path between die 21 and slug 24a. It also eliminates wires, wire bonds, and most of the surface metallization from the current path. Furthermore, if heat is generated mainly at the upper surface of die 21, as in a MOS-gated device, that surface is coupled directly to slug 24a for the most efficient possible heat exchange.

Figure 4:
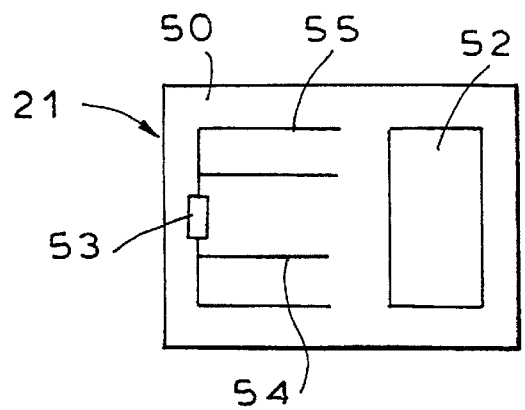
FIG. 4 shows a top view of a MOS-gated semiconductor chip or die which can be mounted in accordance with the invention.
Figure 5:
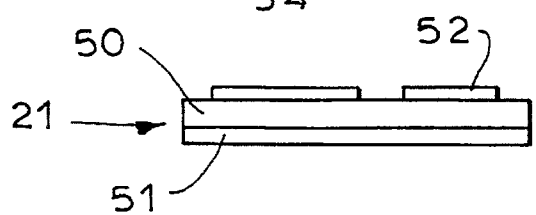
FIG. 5 is a side view of FIG. 4.

FIGS. 4 and 5 show one possible embodiment for die 21, as a power MOSFET die. Thus, the die can, for example, have a silicon body 50, a bottom electrode 51, a source pad 52 and a gate pad 53 which has gate pad fingers 54, 55. The gate pad fingers are insulated from the source metal which covers the full top surface of the chip.

Figure 6:
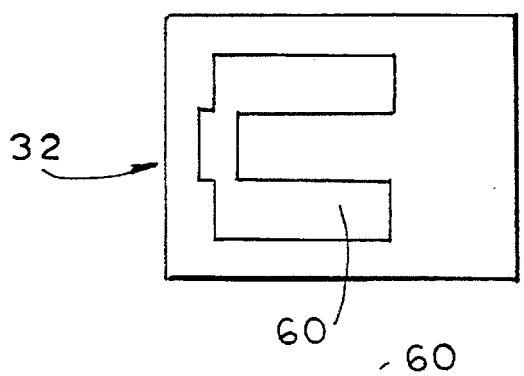
FIG. 6 is a top view of the metal slug of the present invention.
Figure 7:
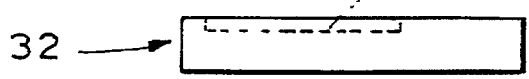
FIG. 7 is a side view of FIG. 6.

The slug 24a, which may be of any good thermally conductive material, but is preferably electrically conductive as well, may be of metal (copper) and, in the case of FIGS. 6 and 7, will have a depressed surface region 60 to avoid contact to the gate pad 53 or fingers 54 and 55 of die 21 of FIGS. 4 and 5. Obviously, any other desired configuration can be used.

In the preceding description of the invention, the slug 24a can be facing up or down. When down, a lower on-resistance is obtained if the chip 21 is a power MOSFET because it is better thermally connected to the circuit board receiving the device. When positioned to face up, the slug is positioned for a possible solder connection to a heat sink.

Figure 9:
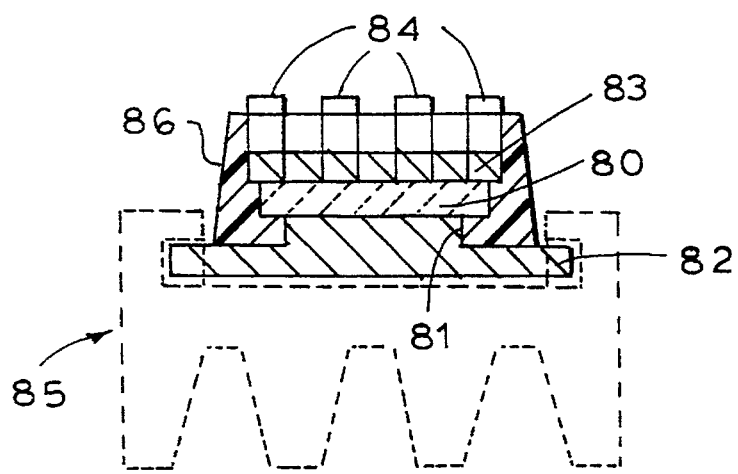
FIG. 9 shows a second embodiment of the invention.

FIG. 9 shows another embodiment of the invention in which a chip 80, which may be a power MOSFET with its source side facing down, is disposed atop a projecting boss 81 of a source slug 82. The chip 80 may be of the type shown in U.S. Pat No. 5,008,725. The drain material of MOSFET 80 is secured to a lead frame drain conductor 83 which has lead frame leads 84 extending therefrom. A slide-on heat sink 85, shown in dotted line outline, is fixed over the structure. A plastic molded housing 86 encloses chip 80 and slug boss 81.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A surface mount package comprising, in combination: a thin, flat semiconductor die having a bottom surface and a top surface and having heat-generating junctions formed in said top surface and having lead connection regions on its top surface; a lead frame having a body portion having a top surface and a bottom surface and having a lead conductor insulated from and extending from portions adjacent to side portions of said body surface and a thermally conductive slug having top and bottom parallel, generally flat surfaces; said bottom surface of said die being thermally connected directly to said bottom surface of said lead frame; said top surface of said slug being directly connected to said top surface of said die and being wider than said bottom surface of said slug; at least one of said lead conductors having first portions thereof connected to at least one of said lead connection regions of said top surface of said die; a molded housing enclosing at least portions of said die, said lead frame and said slug; said bottom surface of said slug being exposed for connection to a flat mounting surface; portions of said lead conductors extending beyond the exterior of said molded housing; said lead conductor being downwardly bent at the exterior of said package and terminating in a plane which is generally coplanar with said bottom surface of said slug.

2. The package of claim 1, wherein said slug is comprised of metal.

3. The package of claim 1 where said bottom surface of said die is metallized, and wherein said bottom surface of said die is soldered to said bottom surface of said bottom portion of said lead frame.

4. The package of claim 1 wherein said die is a MOS-gated device having at least one gate pad and at least one power electrode pad on said top surface of said die; said top surface of said thermally conductive slug being soldered to said power electrode pad of said die; at least one of said lead conductors connected to said gate pad.

5. The package of claim 1, wherein said bottom surface of said thermally conductive slug is exposed for connection to an external heat exchange surface that comprises said flat mounting surface.

6. The package of claim 1, wherein said thermally conductive slug includes a notch located about the periphery of said slug at said top surface and which is surrounded by said molded housing to lock said slug to said molded housing.

7. The package of claim 4, wherein said slug is comprised of metal.

8. The package of claim 4 where said bottom surface of said die is metallized, and wherein said bottom surface of said die is soldered to said bottom surface of said bottom portion of said lead frame.

9. The package of claim 4, wherein said thermally conductive slug includes a notch located about the periphery of said slug at said top surface and which is surrounded by said molded housing to lock said slug to said molded housing.

10. The package of claim 5 where said bottom surface of said die is metallized, and wherein said bottom surface of said die is soldered to said bottom surface of said bottom portion of said lead frame.

11. The package of claim 7, wherein said bottom surface of said thermally conductive slug is exposed for connection to an external heat exchange surface that comprises said flat mounting surface.

* * * * *